United States Patent [19]

Rotay

[11] Patent Number: 5,422,522
[45] Date of Patent: Jun. 6, 1995

[54] DEVICE FOR BIASING AN RF DEVICE OPERATING IN QUASI-LINEAR MODES WITH TEMPERATURE COMPENSATION

[75] Inventor: Craig J. Rotay, Lansdale, Pa.

[73] Assignee: SGS-Thomson Microelectronics, Inc., Carrollton, Tex.

[21] Appl. No.: 932,755

[22] Filed: Aug. 20, 1992

[51] Int. Cl.[6] .................... H03K 3/42; H03K 17/60; G05F 1/10; H03F 3/04
[52] U.S. Cl. ..................... 327/512; 327/575; 327/482; 327/483; 327/530; 327/535; 330/289; 330/296; 330/297
[58] Field of Search ............ 307/310, 315, 254, 296.1, 307/296.6, 303; 330/256, 266, 289, 272, 311, 296, 297; 327/512, 575, 482, 483, 530, 535

[56] References Cited

U.S. PATENT DOCUMENTS

| | | | |
|---|---|---|---|
| 4,242,598 | 12/1980 | Johnson et al. | 307/310 |
| 4,320,349 | 3/1982 | Freers et al. | 330/66 |
| 4,663,599 | 5/1987 | Patch | 330/311 |
| 4,924,194 | 5/1990 | Opas et al. | 330/289 |
| 5,160,898 | 11/1992 | Black | 330/289 |

OTHER PUBLICATIONS

Gunther, "Low Impedance, Temperature Compensated Bias Supply", *Motorola Technical Disclosure Bulletin*, vol. 3, (1983), p. 20.
Helge Granberg, "Biasing Solid State Amplifiers to Linear Operation", RF amplifiers, pp. 72–76, Apr. 1991.
Bruce Utter, Application Note for Z0-28 Communications Transistor Corporation: Application Note for Z0-028, Acrian Power Solutions (Jan. 1989).

*Primary Examiner*—Timothy P. Callahan
*Assistant Examiner*—Trong Phan
*Attorney, Agent, or Firm*—Allan Ratner; Rodney M. Anderson; Lisa K. Jorgenson

[57] ABSTRACT

A biasing device which is in thermal contact with an RF device for actively biasing the RF device operating in quasi-linear modes. The biasing device provides a low impedance current source with high current capability to the base of the RF device. The biasing device includes three specially-processed transistors. The second and third transistors are connected such that their base-emitter and base-collector junctions are in parallel effectively forming two exceptionally low turn on series diodes. The result of reducing the resistances of the second and third transistors, by configuration and processing, is that they turn on slightly before the RF device is biased to its quiescent point.

17 Claims, 4 Drawing Sheets

DEVICE FOR BIASING AN RF DEVICE OPERATING IN QUASI-LINEAR MODES WITH TEMPERATURE COMPENSATION

FIELD OF THE INVENTION

The present invention relates generally to a device for biasing an RF device and, more particularly, to a single-package integrated circuit device using specially-processed transistors for biasing an RF device operating in quasi-linear modes.

BACKGROUND OF THE INVENTION

It is well-known that RF devices operating in quasi-linear modes require biasing circuitry. In these modes, effective biasing circuitry should supply the RF device with its current requirements while accounting for drifts in the RF device's operating point due to temperature variations. If uncontrolled, the drifting due to temperature may lead to catastrophic device failure (i.e., "thermal runaway").

Thus, the effectiveness of a biasing device is related to its current supply capability, its internal resistance (which also affects it current supply capability) and its ability to prevent thermal runaway (caused by uncontrolled drifting of the operating point). Additional considerations for determining the usefulness and appeal of a biasing device include the amount of space it consumes, the need for support devices, and the effects on total amplifier efficiency, linearity, stability and reliability.

Traditional biasing techniques such as resistive voltage division, diode bias or bypassed emitter bias can no longer satisfy the aggressive specifications imposed on RF transistors without substantial reduction in total system efficiency and/or common-emitter power gain. These techniques also tend to degrade (or limit) the linearity and dynamic range of the RF device under test.

SUMMARY OF THE INVENTION

A biasing device being in thermal contact with an RF device for actively biasing the RF device operating in quasi-linear modes. The biasing device provides a low impedance current source with high current capability to the base of the RF device. The biasing device includes three transistors. The base of the second transistor is connected to the base of the first transistor and the collector of the second transistor is connected to the emitter of the second transistor for reducing the resistance. The base of the third transistor is connected to the emitter of the second transistor and the collector of the third transistor is connected to the emitter of the third transistor for reducing the resistance. The result of reducing resistances of the second and third transistors is that they turn on slightly before the RF device is biased to its quiescent point.

BRIEF DESCRIPTION OF THE DRAWINGS

The invention is best understood from the following detailed description when read in connection with the accompanying drawings, in which:

FIG. 1b is a schematic representation of FIG. 1a;

FIG. 2 is an illustration of the diamond matrix architecture used for processing one of the transistors in FIG. 1a;

FIG. 3 is an illustration of the interdigitated architecture used for processing two of the transistors in FIG. 1a;

FIG. 6b shows a the quiescent current supplied to the RF device during the conditions shown in FIG. 6a;

DETAILED DESCRIPTION OF THE INVENTION

A. Definitions

Within this specification, the following terms or phrases have the corresponding definitions:

RF device. RF NPN Bipolar Transistor

Quasi-linear modes. Modes of operation during which the conduction angle in a common emitter configuration falls at or between 180° and 360°. These modes are generally referred to as classes $AB_1$, $AB_2$ and B.

B. Overview

Figure 1A:
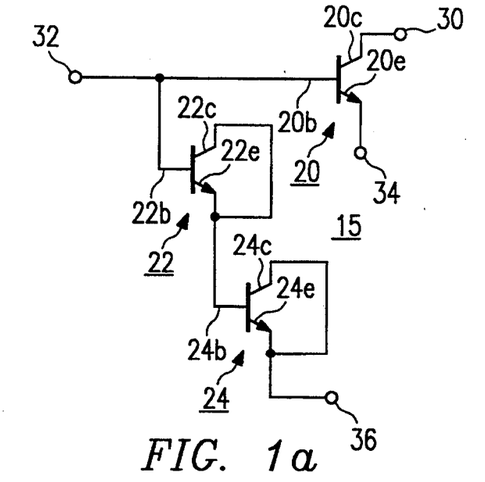
FIG. 1a is a circuit diagram of a biasing device in its basic configuration.

Biasing device 15, as shown in FIG. 1a, is a single package integrated circuit (IC) consisting of three specially-processed transistors. Biasing device 15 provides an exceptionally low-impedance current source with superior thermal tracking for an RF device operating in quasi-linear modes.

Biasing device 15 is capable of supplying a range of current (from nanoAmperes to Amperes) to the base connection of an RF device without adversely affecting its ability to track the base-emitter voltage ($V_{be}$) of the RF device. Some potential adverse effects, which have been minimized by the chosen architectures and specially-processing the transistors in the biasing device 15, typically arise from a transistor's internal resistance which can not only limit its current capabilities but also distort (relative to those of the RF device) the turn-on characteristics of the compensating transistors.

Biasing device 15 provides this range of current while accurately tracking changes in the RF device's $V_{be}$ with respect to temperature. Voltage changes occur due to an intrinsic characteristic of all silicon PN junctions, varying only slightly from device type to device type, which is that the PN junction voltage decreases by 2 to 2.5 millivolts per increase of 1° C. The changing $V_{be}$ causes the operating point of the RF device to drift and, if inaccurately tracked by the biasing device, will likely cause the RF device to enter thermal runaway leading to catastrophic device failure.

Thus, to prevent thermal runaway, the biasing device 15 employs an active biasing technique capable of accurately tracking the change in $V_{be}$ (with temperature) for the RF device while satisfying the RF device's current requirements in both switching and non-switching modes.

For a non-switching RF device, thermal runaway occurs if the base bias supply voltage to the RF device remains constant as the base-emitter junction potential decreases in response to increasing temperature. As the junction potential difference decreases, increasing collector current for the RF device is allowed to flow which is dictated by the increasingly over-driven base. A cycle is created as the increased collector current causes the junction temperature to rise, and, correspondingly, the base is effectively over-driven as a result of the constant base bias supply voltage. The cycle allows the collector current to increase exponentially. Eventually, high fusion currents destroy the device, thus, ending the cycle.

For a switching RF device, the above description applies with some additional concerns. First, the biasing device should have a sufficiently low source impedance in order to source high levels of base current (which increases with increasing RF drive levels) without losing regulation of the RF BJT's bias point.

Second, the biasing device must sense changes in the RF device's junction temperature, and compensate for the change in the $V_{be}$ at any point during the RF cycle, as well as during changes in the RF signal's amplitude.

And, third, the biasing device can not be susceptible to the rectification effects of the RF BJT's base-emitter junction during which the negative voltage developed opposes the positive bias voltage which tends to lower the bias point of the RF device.

Accurately tracking the base-emitter voltage of an RF device while providing a low impedance current source are important features to designers requiring maximum linear performance, stability, easy-to-control operating points, overall quasi-linear amplifier reliability and high system efficiency. In addition to these desirable properties, due to its processing and packaging, the biasing device requires minimal board space and a minimal number of support devices.

B. Construction

As seen in FIG. 1a, in its basic configuration, biasing device 15 comprises three transistors, 20, 22 and 24. Transistors 22 and 24 are connected in series and are the compensating transistors. In the exemplary embodiment of biasing device 15, all connections between transistors are made using 0.002" O.D. gold wire.

Collector 22c is directly connected to emitter 22e of transistor 22. And, emitter 22e, along with collector 22c, of transistor 22 is directly connected to 24b of transistor 24. Similarly, collector 24c is directly connected to emitter 24e of transistor 24.

Directly connecting collectors 22c and 24c of the two transistors to their respective emitters 22e and 24e, along with certain processing features described below, effectively results in two exceptionally low turn-on series diodes 26 and 28 (see FIG. 1b). Thus, by reducing the resistance of each effective series diode 26 and 28, a characteristic curve, as seen in FIGS. 6c and 6d, for each diode can be achieved that mirrors the characteristics of the RF device yet at lower voltages.

Figure 6A:
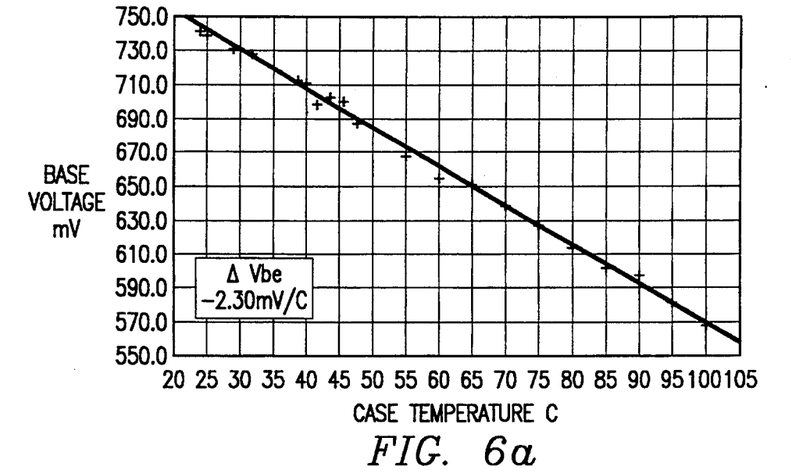
FIG. 6a shows a temperature versus voltage performance graph for the biasing device of FIG. 5.
Figure 6B:
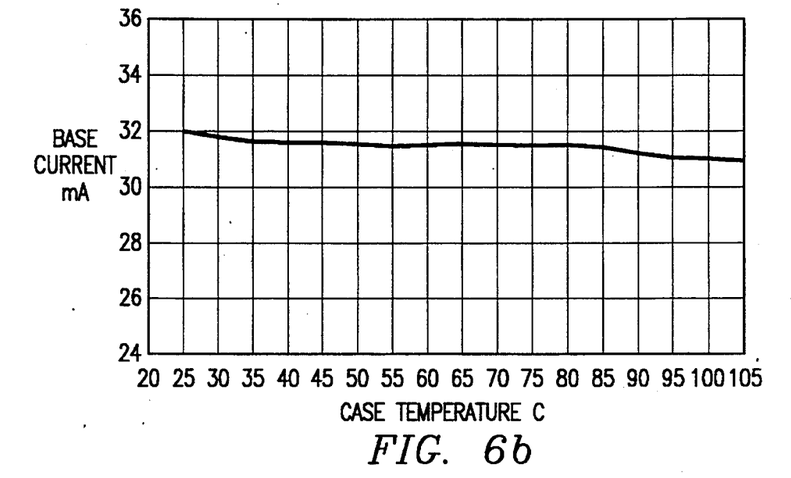
Figure 6C:
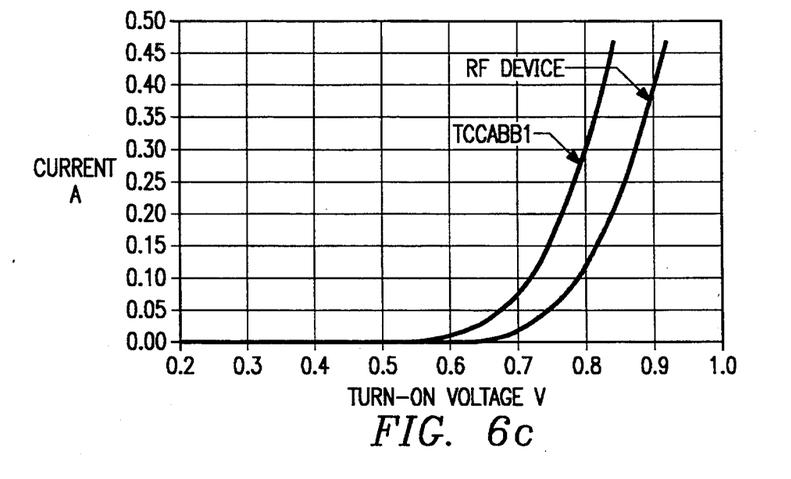
FIG. 6c shows a comparison between the base-to-emitter characteristic curve of a compensating transistor (diode) versus that of a standard RF device for high current.
Figure 6D:
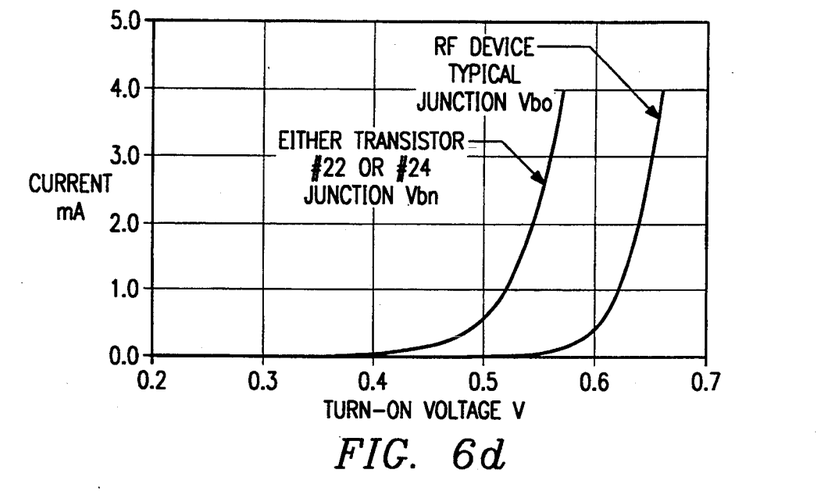
FIG. 6d shows a similar comparison to FIG. 6c at low current, exemplifying the mirror-like tracking ability of the biasing device.

The relationship illustrated in FIGS. 6c and 6d is advantageous because diodes 26 and 28 turn on at a voltage slightly less than the voltage needed to bias an RF device to its quiescent level. As seen in FIGS. 6c and 6d, the voltage difference is approximately 0.05 to 0.1 volts. This ensures that both devices, the biasing device 15 and the RF device, are operating at mirroring points along their turn-on curves simultaneously. The difference between the two curves is the result of the compensating transistor, 22 and 24, being situated at two stages of gain prior to the RF device, and is a key feature to the overall performance of biasing device 15.

Collector 20c is connected to terminal node 30. Base 20b and base 22b are both connected to terminal node 32. Emitter 20 leads to terminal node 34, and emitter 24e leads to terminal node 36. Terminal nodes 30, 32, 34 and 36 are connected, via gold wires, to the IC's package leads, hence, they are externally accessible.

Base 22b and emitter 22e, in parallel with base 22b and collector 22c, form the first PN junction, having an approximate forward bias breakdown voltage of 0.7 v ($V_{fbe}$). Base 24b and emitter 24e, in parallel with base 24b and collector 24c, form the second PN junction, also having an approximate forward bias breakdown voltage of 0.7v. Thus, the total voltage drop from base 22b to emitter 24e is approximately 1.4 v. It should be noted that the total voltage drop is actually slightly lower due to the lowered resistance of the devices stemming from the paralleled junction configuration and certain processing techniques.

Figure 1B:
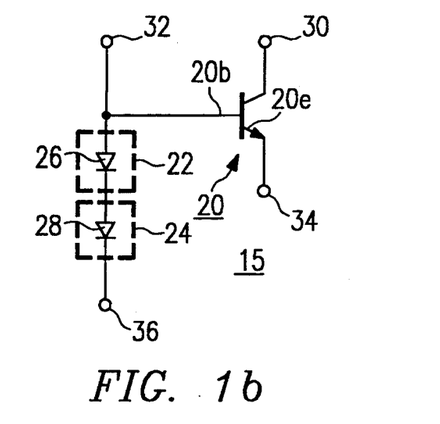

Because paralleled junctions of transistors 22 and 24 are used, the circuit in FIG. 1a can be schematically represented as in FIG. 1b where the parallel junctions of transistor 22 correspond to diode 26 and the parallel junctions of transistor 24 correspond to diode 28.

In the exemplary embodiment of biasing device 15, transistor 20 is specially-processed and selected for suitable operation in an emitter-follower configuration having extremely low source impedance, as required by an ideal current source. Transistor 20 has an internal resistance of approximately 100 milliohms and an $H_{fe}$ of 35.

Figure 2:
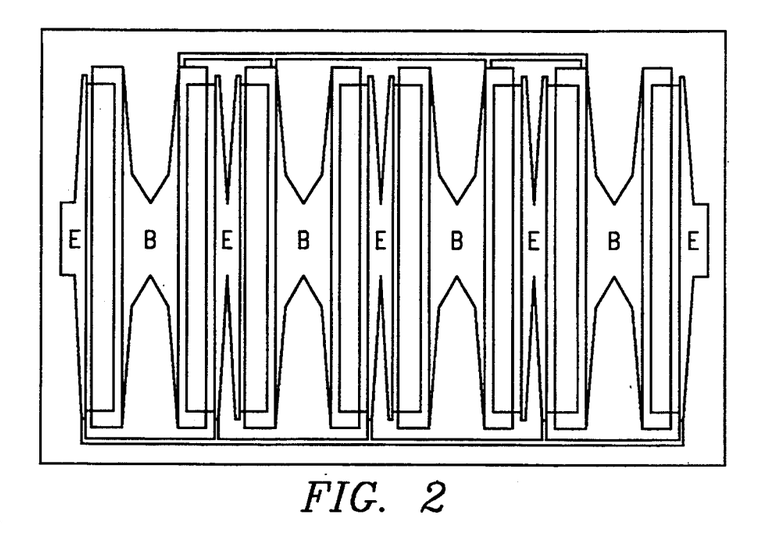

The top level mask of transistor 20 employs a conventional diamond matrix architecture, as seen in FIG. 2, and consists of refractory gold metallization and large bond pad areas for gold wirebonding. Bonding areas are designated by "E" for emitter connections and "B" for base connections. The collector connection for this type of RF transistor is the entire underside (not shown) which consists of a barrier metal layer of tungsten which allows gold to be plated to the wafer. The two step process involves high voltage sputtering of the barrier metal onto the silicon substrate, which prevents the highly porous gold backside from diffusing into the silicon, thus, destroying previously created junctions. The gold is then electroplated to barrier metal using standard techniques. The backside gold metallization allows the completed transistor die to be eutectically attached to the gold metallization within the package.

The above metallization steps follow numerous processing steps involving photolithography techniques to develop base and emitter regions from layer masks onto the starting substrate (N type collector region). This is accomplished by exposing photoresist which allows particular areas to remain while others are etched away. The layer masks are used in sequence to form base and emitter regions, where, after etching, a P or N type dopant (respectively) is introduced at specific levels of concentration. After contacts to the base and emitter regions through insulating barriers of oxide are formed, connections to the top metal layers complete the fabrication of the transistors. These apply to both NPN and PNP BJT's; however, the exemplary embodiment of biasing device 15 involves NPN BJT's.

Some distinguishing characteristics of biasing device 15 are inherent in the geometry of transistor 20, while others are introduced at specific points during fabrication of transistors 20, 22 and 24. The geometry of transistor 20, was chosen for its high emitter periphery, specifically for the high number of base-emitter junctions throughout the chip, which provides low source impedance and, consequently, high current capability.

Additionally, the diffusion of the emitter into the base region was specifically processed for a low forward voltage drop ($V_{fbe}$) which further lowers the impedance by reducing the junction's internal resistance. Also, the base diffusion for this die type is exceptionally large (i.e., high base area) and has a wide depletion region. This translates into inherent stability even at low frequencies by reducing the likelihood of oscillations, as well as lowering the $H_{fe}$ which allows for a greater margin of error when adjusting biasing device 15 to properly bias an RF device.

Finally, the substrate (starting material) of transistor 20 contains thick, high resistivity epitaxial layers which give the collector region a high breakdown voltage. This decreases the collector to emitter leakages (which tend to forward bias the RF transistor), thus extending the operating voltage range of biasing device 15. In fact, the breakdown voltage is high enough to allow biasing device 15 to operate at the normal operating voltages of today's linear RF transistors. This affords advantages in both reliability and versatility.

In the exemplary embodiment of biasing device 15, the fabrication of transistors 22 and 24 is similar to that of transistor 20 except as described below.

Figure 3:
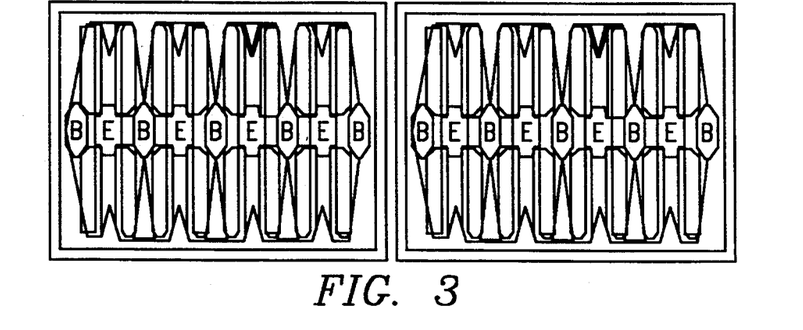

The top level masks of transistors 22 and 24 employ a conventional interdigitated architecture as seen in FIG. 3. The geometry of transistors 22 and 24 has been chosen for its thermal tracking capability. Because this architecture mimics that used in standard RF devices, the ability of compensating transistors 22 and 24 to compensate for an RF device is inherently enhanced.

This occurs for several reasons. First, the interdigitated geometry is dense and symmetrical which is critical to proper current sharing which, in turn, is necessary for optimal compensation.

Second, because the base and emitter regions of transistors 22 and 24 are geometrically the same as those of a standard RF device, the base-emitter characteristic curves of transistors 22 and 24 will closely resemble those of a given RF device.

Third, the intentional polysilicon emitter ballast (or internal resistance) for transistors 22 and 24 is processed using the same techniques used for standard RF devices, although the level of the total junction resistance for transistors 22 and 24 is lower for reasons described below.

The geometry chosen for transistors 22 and 24 also incorporates a large number of active areas having high quantities of base and emitter fingers. The fingers significantly increase the emitter periphery and, when coupled with the paralleled junctions, increases the current handling capability, thereby extending the useful operating range of biasing device 15.

In addition to the geometry, certain processing modifications for transistors 22 and 24 are important to achieve optimal compensation characteristics.

First, the processing begins with lower resistivity starting material (lower relative to transistor 20) translating to lower junction breakdown voltages. This means that the junctions, in particular the base-emitter, of transistors 22 and 24 behave similarly to those of a standard RF device, but will generally begin to breakdown at slightly lower voltages.

Additionally, the emitter resistance of transistors 22 and 24 is intentionally lowered during the ballast processing step to further ensure lower-voltage turn on characteristics. This is accomplished by using the lowest ballasting necessary to promote equal current sharing between active areas.

Finally, because transistors 22 and 24 are connected (as previously discussed) in such a way that the base-collector junctions are in parallel with the base-emitter junctions (effectively forming two very low turn-on series diodes 26, 28), normal transistor action ceases. This means that the $H_{fe}$ of transistors 22 and 24 is no longer a concern, hence, allowing for much simpler ion implantations of dopant into the base and emitter regions during processing. This significantly improves high overall device yields.

The low turn-on characteristic of the effective series diodes 26 and 28 is important for proper compensation of an RF device. The bias voltage which is related to the base bias current supplied by biasing device 15 to the RF device will likely be greater than the bias voltage at the base of transistor 20, due to the $H_{fe}$ associated with transistor 20. Thus, the low voltage turn-on of the series diodes 26 and 28 allows them to track the RF device's turn-on characteristic curve at a proportionally lower voltage, as seen in FIGS. 6c and 6d. This ensures that diodes 26 and 28 are fully turned on by the time the RF device is biased at higher quiescent levels, thereby providing linear compensation of the [delta]$V_{be}$ within an RF device at all operating points.

Additionally, this allows biasing device 15 to properly track the $I_{cq}$ point even with extremely low bias levels such as those in class B mode where the RF device is biased at cutoff.

The above features offer enhancements in all major performance areas, for instance, linearity and intermodulation distortion, stage gain, and amplifier stability. Because biasing device 15 is designed for low current consumption, especially when compared to other transistor biasing techniques, system efficiency can dramatically increase.

Figure 4A:
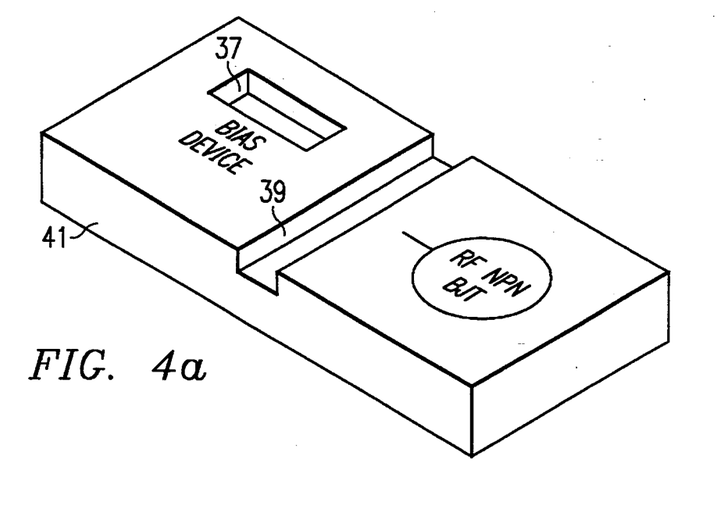
FIG. 4a shows an isometric view of the circuit board on which the biasing device and an RF device will be mounted.
Figure 4B:
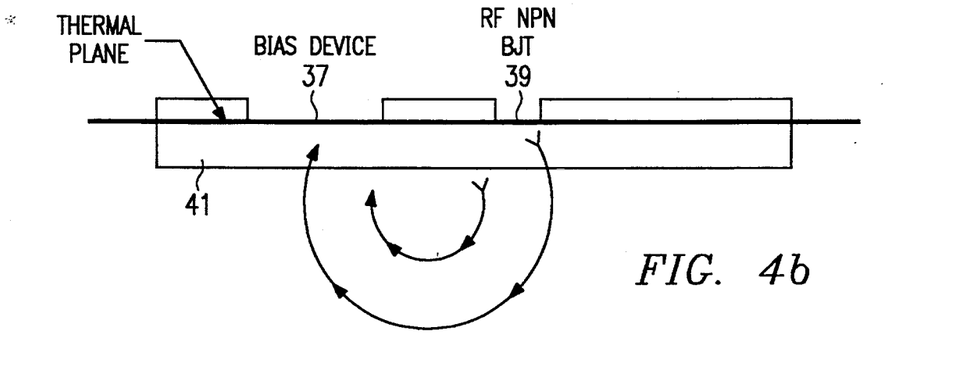
FIG. 4b shows a side view of FIG. 4a with arrows representing thermal transfer from the location of the RF device to the location of the biasing device.

Biasing device 15 is provided in a single package. Since efficient tracking of the biasing device 15 depends on accurately sensing the temperature of the RF device, the package should be thermally conductive. Additionally, the package should be positioned in the same thermal plane and, preferably, in close proximity to the RF device (in the exemplary embodiment of a biasing device 15, this distance is approximately within 2-3 inches of the RF device). FIG. 4a shows the thermally conductive mounting plane 41 indicating the locations 37, 39 at which both the biasing device 15 and RF device are secured, respectively. FIG. 4b, using arrows, illustrates the thermal transfer from the location 39 of the RF device to the location 37 of biasing device 15.

It should be noted that the closer the biasing device 15 is positioned relative to the RF device, the faster it can compensate due to the changes in temperature and voltage. More particularly, thermal transfer over an increasingly large distance results in an increasing thermal time constant, which adds to the time it takes biasing device 15 to compensate within the thermal feedback loop. This means that the adjustment in bias point will not be a linear function with respect to temperature, but, instead, a distantly placed biasing device 15 will likely under-compensate while the RF device heats up and over-compensate as the RF device cools down. This is known as thermal hysteresis. Thus the goal is to linearize the hysteresis characteristic by minimizing the distance between biasing device 15 and the RF device, thus reducing the thermal time constant.

In the exemplary embodiment of biasing device 15, the package includes a thermally conductive copper base and/or flange and a non-hermetically sealed ceramic lid. Also, the footprint of the package should be sufficiently large in area such that adequate thermal conductivity occurs.

C. Use and Operation

In use, continuing with FIG. 1a, the terminal node connections 30, 32, 34 and 36 are used in the following way:

Terminal node 30 is the positive voltage supply ($+V_{ce}$). In the exemplary embodiment of a biasing device 15, terminal node 30 is capable of being operated at any $V_{ce}$ of the RF device from 5 v to 50 v. This is a significant increase in range relative to existing devices.

Terminal node 32 is the bias adjust voltage. The voltage at this node should be selected such that transistor 20 is forward biased. It should be noted that this is easily accomplished with a variable resistor in rheostat configuration; and, with simple computations, a fixed resistor can permanently set the bias point.

Terminal node 34 is the base bias voltage. This is the output of the biasing device 15 which provides a temperature compensated base voltage to the RF device with dynamic current capability. This voltage is calculated by $V_{fbe}$—[delta]$V_{be}$.

Terminal node 36 is grounded (or connected to a third diode). Because the thermal tracking of the biasing device 15 is dependent on sensing the temperature of the RF device, the biasing device's position relative to the RF device is critical, requiring that it must be in close proximity. However, when this is physically impossible for mechanical reasons or otherwise, two more diodes may be added, external to the IC. The first diode is placed between transistor 20 and the RF device but in the same thermal plane as biasing device 15. It is this diode which now corresponds to and is compensated for by transistor 24. The second diode is placed between transistor 24 and ground but in the same thermal plane as the RF device. It is this diode which now corresponds to and compensates for the base-emitter junction of the RF device. This diode may be smaller and, therefore, easier to place near the RF device.

Figure 5:
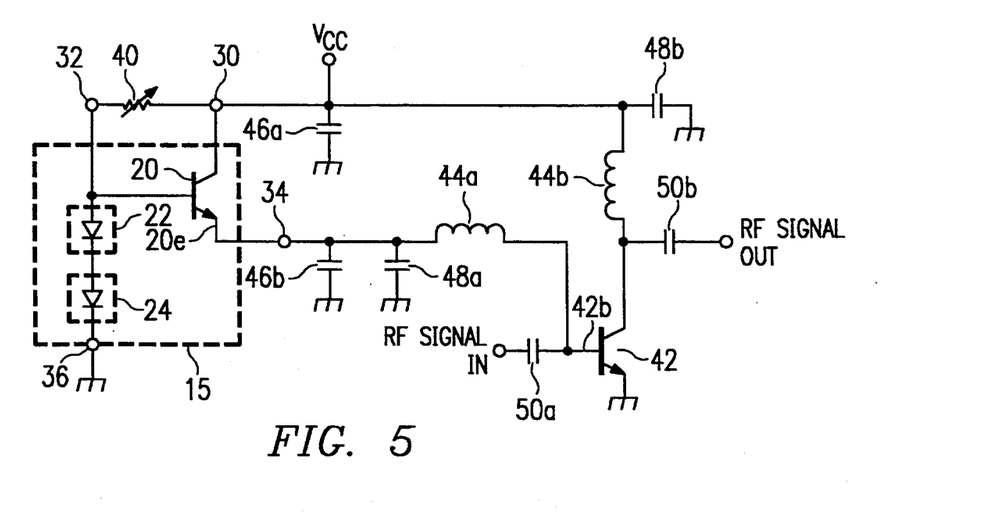
FIG. 5 shows the biasing device of FIG. 1a connected to an RF device for biasing purposes.

FIG. 5 shows an RF device connected, for biasing purposes, to biasing device 15. A variable resistor 40 is connected between terminal nodes 30 and 32. Emitter 20e of transistor 20 is connected to inductor 44a, which performs the function of an RF choke. Inductor 44a is then connected to base 42b of RF device 42. Collector 20c of transistor 20 is connected to $V_{ce}$ as well as inductor 44b which also performs the function of an RF choke. Inductor 44b is then connected to collector 42c of RF device 42.

In operation, a user should select the appropriate value for resistor 40 such that RF device 42 is properly biased and an equilibrium is achieved with respect to temperature. Although there are numerous ways for calculating an appropriate value for resistor 40, a brief description of one possible method is provided:

To determine the appropriate value for resistor 40, the values for RF device's 42 quiescent current ($I_{cq-rf}$), the D.C. current gain ($H_{fe-rf}$) for RF device 42 and the D.C. current gain ($H_{fe-bd}$) for biasing device 15, and the source voltage ($V_{ce}$) are required.

Next, the base current ($I_{b-rf}$) for RF device 42 is calculated: $(I_{b-rf}) = (I_{cq-rf})/(H_{fe-rf})$. In the exemplary embodiment, ($I_{b-rf}$) is supplied by biasing device 15 at approximately 0.7 v ($V_{be-rf}$).

Next, the base current ($I_{b-t20}$) for transistor 20 is calculated: $(I_{b-t20}) = (I_{b-rf})/(H_{fe-bd})$. In the exemplary embodiment, ($H_{fe-bd}$) is intentionally low (approximately 30 to 35) such that it is insensitive to varying ($H_{fe-rf}$) as well as forcing more controllable values of resistor 40.

Next, the current through the series diodes ($I_{dio}$) can be approximately ($I_{b-rf}$). This is due to the turn-on characteristics of the diodes and the RF device. Furthermore, an increasing ($I_{dio}$) ensures proper tracking of the bias voltage with temperature and allows a linear shift in bias point with increasing (or decreasing) RF drive levels. It should be noted that operating on the "knee" of the diode's turn-on characteristic results in degraded thermal tracking and non-linear ($V_{be-rf}$) voltages with respect to ($I_{b-rf}$). These effects can be seen conceptually. However, the special processing of compensating transistors 22 and 24 tends to minimize the ($I_{dio}$) of the biasing device, thus making ($I_{dio}$) = ($I_{b-rf}$) a possible yet rare occurrence. Additionally, operation on the "knee" of the characteristic curve of compensating transistors 22 and 24 is less crucial due to biasing device's 15 inherent tracking capabilities.

Next, ($I_{adj}$) is calculated: $(I_{adj}) = (I_{dio}) + (I_{b-t20})$. Then, the "on" resistance of the series diodes for quiescent conditions is calculated: $(R_{dio}) = (V_{be-dio})/(I_{dio})$.

In the exemplary embodiment, ($V_{be-dio}$) is approximately 1.4 v.

Finally, the value for resistor 40 can be calculated: resistor 40 equals ($R_{tot} - R_{dio}$) where ($R_{tot}$) equals ($V_{ce}$)/($I_{adj}$), or resistor 40 equals (($V_{ce}$) − ($V_{be-dio}$)/($I_{adj}$).

It should be noted that these equations represent the theory of operation. Because most parameters are determined empirically, and change dynamically from various conditions and devices, the results obtained from these calculations are approximate values. In practice, the value of resistor 40 will likely range from 500 to 15000 Ohms. Furthermore, enhanced control is realized by the addition of a low value resistor from the $V_{be}$ output of biasing device 15 to ground at the expense of some system efficiency. The increase in total biasing device current decreases the value of resistor 40, yet increases overall bias stability.

As RF device 42 begins to operate, its temperature increases. The temperature increase causes the base-emitter voltage of RF device 42 to decrease at a rate of 2 millivolts/° C. As the base-emitter voltage decreases, RF device 42 maintains its quiescent current requirements. If the voltage external to RF device 42 either is kept constant or inaccurately tracks the base-emitter voltage of RF device 42, the mismatch can create circumstances leading to thermal runaway as described earlier.

Because biasing device 15 is required to be in the same thermal plane as RF device 42, as the temperature increases, transistors 22 and 24 (theoretically compensating for transistor 20 and 42, respectively) also heat up. As their temperatures increase, their base-emitter voltages also drop at the same rate as those of transistor 20 and RF device 42. This corresponding decrease in voltage ensures that the base voltage external to RF device 42 tracks the internal base-emitter voltage, thus, preventing thermal runaway.

Additionally, as transistors 22 and 24 heat up, more current flows through them and less flows to the base of transistor 20. This lowering of base current to transistor 20 provides constant quiescent level of current flow to the base 42b of RF device 42; thus, the current flow to RF device 42 is regulated by biasing device 15 by using the temperature of RF device 42 as an input parameter. It should be noted that resistor 40, acting in conjunction with transistors 22 and 24 as a voltage divider, somewhat restricts the flow of current from the source to the base of transistor 20.

It should be noted that, when biasing an RF device, proper bypassing and filtering techniques, well-known by those skilled in the art, should be used. Standard bypassing techniques are satisfactory for this circuit. Also, additional filtering should be considered when long lead lengths or connection runs are used.

As seen in FIG. 5, capacitors 46a and 46b provide filtering for the circuit. In the exemplary embodiment, each capacitor, 46a and 46b, is approximately 0.1 microF. High frequency bypassing is provided by capacitors 48a and 48b. And, D.C. block matching network is provided by 50a and 50b.

FIGS. 6a and 6b show the performance of biasing device 15 in a non-switching state. FIG. 6a illustrates biasing device 15 ability to precisely track an RF device's base-emitter voltage due to temperature changes. And, FIG. 6b illustrates, while tracking the base-emitter voltage, biasing device 15 supplies the necessary quiescent current for proper biasing of the RF device under those conditions.

D. Alternate Embodiments

Figure 7A:
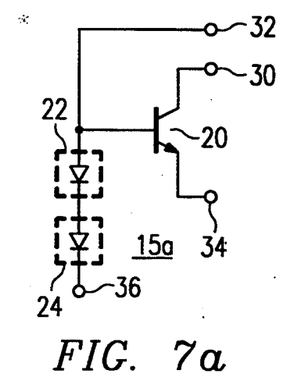
FIG. 7a shows the biasing device of FIG. 1a in its basic configuration.

FIGS. 7a through 7e show schematic diagrams of multiple embodiments in which the biasing device invention can be used. FIG. 7a shows the basic configuration of the biasing device 15a, this embodiment is described above.

Figure 7B:
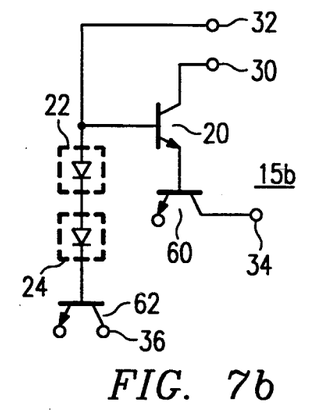
FIG. 7b shows an alternate embodiment of the biasing device in FIG. 7a modified to protect against a reverse voltage.

FIG. 7b shows a schematic diagram of a biasing device 15b which has two additional transistors 60 and 62. The purpose of transistor 60 is to provide reverse voltage protection. Terminal node 34 is connected to the collector of transistor 60 such that any voltage present at node 34 now travels through the collector-base junction of transistor 60 before reaching the emitter-base junction of transistor 20. Although this somewhat increases the source impedance, the collector-base breakdown voltage (approximately 50–70 v) by far exceeds the emitter-base breakdown voltage (approximately 5v), thus, providing significant protection for the biasing circuit from a reverse voltage caused by a short-circuit or other unexpected condition.

It should be noted that because the base-collector junction is positioned between transistor 20 and an RF device, this junction needs to be compensated for by placing a base-collector junction after the two series diodes in order to ensure accurate thermal tracking and current regulation. As seen in FIG. 7b, this is done using transistor 62.

Figure 7C:
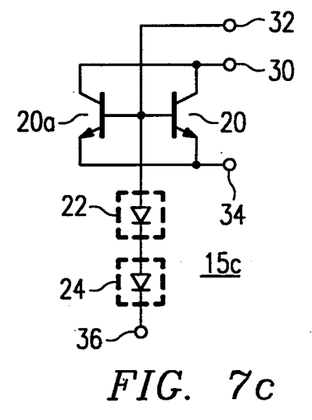
FIG. 7c shows an alternate embodiment of the biasing device in FIG. 7a modified to provide more power output.

FIG. 7c shows a schematic diagram of biasing device 15c which has an additional transistor 20a in parallel with transistor 20 for the purpose of providing more power. The additional transistor 20a provides biasing device 15c with an additional power boost allowing it to provide approximately twice the power. Because the two transistors, 20 and 20a, are in parallel, there is no need, beyond the two transistors 22 and 24 (represented as diodes 26 and 28, respectively), to further compensate. The first transistor 22 can satisfactorily track and compensate for the parallel connection of the transistor's 20a base-emitter junction.

Figure 7D:
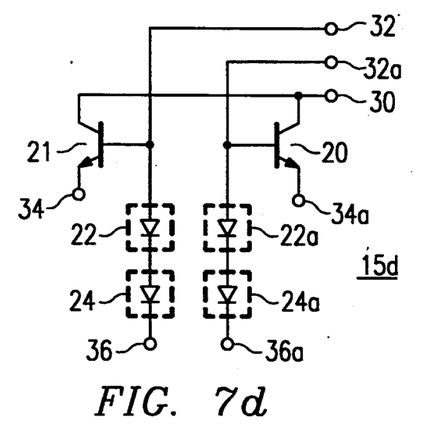
FIG. 7d shows an alternate embodiment of the biasing device in FIG. 7a modified to provide push-pull or dual-stage operation.

FIG. 7d shows a schematic diagram of biasing device 15d which has an additional transistor 21 and two additional diodes, 22a and 24a, for the purpose of providing a biasing device which can operate in a push-pull configuration. Essentially, this embodiment is two basic configurations side by side designed for allowing a single biasing device to regulate two sides of an RF device. It should be noted that each of the terminal nodes 32, 34 and 36, with the exception of terminal node 30, now has corresponding terminal nodes 32a, 34a and 36a. It should also be noted that because of the additional terminal nodes, if the biasing device 15d embodiment is to be used, a package with at least seven leads would be necessary.

Figure 7E:
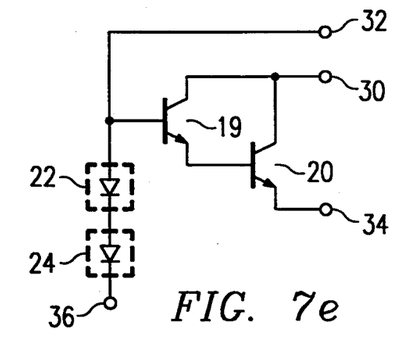
FIG. 7e shows an alternate embodiment of the biasing device in FIG. 7a modified for higher overall efficiency and sensitivity.

FIG. 7e shows a schematic diagram of biasing device 15e which has an additional transistor 19, for the purpose of providing a biasing device which has enhanced efficiency and sensitivity. Essentially, this embodiment adds transistor 19 in a Darlington configuration with transistor 20 to enhance the sensitivity of the overall configuration. As is understood, the addition of transistor 19 into the basic configuration can also be done with the alternate embodiments seen in FIGS. 7b through 7d for enhanced sensitivity.

Although the invention is illustrated and described herein embodied as a single-package integrated circuit for biasing an RF device operating in quasi-linear modes, the invention is nevertheless not intended to be limited to the details as shown. Rather, various modifications may be made in the details within the scope and range of equivalents of the claims and without departing from the spirit of the invention.

What is claimed:

1. A biasing device being in thermal contact with an RF device for actively biasing the base of the RF device operating in quasi-linear modes, said biasing device providing a source of low impedance current and high current capability, comprising:

first, second and third transistors each having a collector, an emitter and a base;

the base of said second transistor directly connected to the base of said first transistor, and the collector of said second transistor directly connected to the emitter of said second transistor for reducing the resistance of said second transistor from base to emitter; and the base of said third transistor directly connected to the emitter of said second transistor, and the collector of said third transistor directly connected to the emitter of said third transistor for reducing the resistance of said third transistor from base to emitter, wherein the turn on voltage of said second and third transistors is less than the voltage for biasing the RF device to its quiescent point.

2. The device of claim 1 wherein said first transistor has a diamond-matrix architecture.

3. The device of claim 2 wherein said second and said third transistors each have an interdigitated architecture.

4. The device of claim 3 wherein said second and said third transistors each have the lowest ballasting necessary for substantially equal current sharing between active areas.

5. The device of claim 4 wherein said second and said third transistors each use starting material with lower resistivity than said first transistor.

6. The device of claim 1, further comprising:
a breakdown protection transistor, having a base connected to the emitter of said first transistor, and having a collector for biasing the base of the RF device; and
a compensating transistor, having a base connected to the emitter and collector of the third transistor, and having a collector for connection to a reference voltage.

7. The device of claim 1, further comprising:
a parallel transistor having a collector connected to the collector of the first transistor, having a base connected to the base of the first transistor, and having an emitter connected to the emitter of the first transistor.

8. The device of claim 1, further comprising:
a parallel first transistor, having a collector connected to the collector of the first transistor, having a base and having an emitter;
a parallel second transistor having a base directly connected to the base of said parallel first transistor, and having a collector and an emitter directly connected to one another for reducing the resistance of said second transistor from base to emitter; and
a parallel third transistor having a base directly connected to the collector and emitter of said parallel second transistor, and having a collector and an emitter directly connected to one another for reducing the resistance of said third transistor from base to emitter;
wherein the turn on voltage of said second and third transistors is less than the voltage for biasing the RF device to its quiescent point.

9. The circuit of claim 1, further comprising:
a fourth transistor having a base connected to the emitter of the first transistor, having a collector connected to the collector of the first transistor, and having an emitter for biasing a base of the RF device.

10. A radio frequency circuit, comprising:
an RF bipolar transistor, having an emitter coupled to a reference voltage and a collector coupled to a power supply voltage, and having a base;
a biasing circuit, comprising:
a first base biasing transistor, having a collector coupled to the power supply voltage, having an emitter coupled to the base of the RF bipolar transistor, and having a base;
a first compensating transistor, having a base connected to the base of the base biasing transistor, and having an emitter and a collector connected together; and
a second compensating transistor, having a base connected to the emitter and collector of the first compensating transistor, and having an emitter and a collector connected together and coupled to the reference voltage; and
a resistor coupled between the power supply voltage and the base of the first base biasing transistor;
wherein the first and second compensating transistors turn on at a voltage less than the quiescent bias of the RF bipolar transistor.

11. The circuit of claim 10, wherein the resistance value of the resistor is selected in such a manner as to provide temperature equilibrium for the RF bipolar transistor in operation.

12. The circuit of claim 10, wherein the base biasing transistor and the first and second compensating transistors are formed within a single integrated circuit.

13. The circuit of claim 12, further comprising:
a thermally conductive mounting plane, to which the integrated circuit and the RF device are mounted.

14. The circuit of claim 10, wherein the geometry of the base and emitter of the first and second compensating transistors is similar to the geometry of the RF bipolar transistor.

15. The circuit of claim 10, wherein the biasing circuit further comprises:
a breakdown protection transistor, having a base connected to the emitter of said first transistor, and having a collector coupled to the base of the RF bipolar transistor; and
a third compensating transistor, having a base connected to the emitter and collector of the second compensating transistor, and having a collector coupled to the reference voltage.

16. The circuit of claim 10, wherein the biasing circuit further comprises:
a parallel base biasing transistor having a collector connected to the collector of the base biasing transistor, having a base connected to the base of the base biasing transistor, and having an emitter connected to the emitter of the base biasing transistor.

17. The circuit of claim 10, wherein the biasing circuit further comprises:
a second base biasing transistor having a base connected to the emitter of the first base biasing transistor, having a collector connected to the collector of the base biasing transistor, and having an emitter coupled to the base of the RF device.

* * * * *